United States Patent [19]

Yano et al.

[11] Patent Number: 4,686,679

[45] Date of Patent: Aug. 11, 1987

[54] WINDOW VSIS SEMICONDUCTOR LASER

[75] Inventors: Seiki Yano, Kashihara; Saburo Yamamoto, Nara; Hiroshi Hayashi, Kyoto; Taiji Morimoto, Nara, all of Japan

[73] Assignee: Sharp Kabushiki Kaisha, Osaka, Japan

[21] Appl. No.: 713,832

[22] Filed: Mar. 20, 1985

[30] Foreign Application Priority Data

Mar. 21, 1984 [JP] Japan .................................. 59-55048
Mar. 21, 1984 [JP] Japan .................................. 59-55049

[51] Int. Cl.$^4$ ............................................. H01S 3/19
[52] U.S. Cl. ............................................. 372/48; 372/46
[58] Field of Search ...................................... 372/46, 48

[56] References Cited

U.S. PATENT DOCUMENTS 4,416,011 11/1983 Olsen ..................................... 372/45
4,546,481 10/1985 Yamamoto et al. ................. 372/48

OTHER PUBLICATIONS

European Search Report, Application Number EP 85 30, 1977.
"Visible GaAlAs V-Channeled Substrate Inner Stripe Laser with Stabilized Mode using p-GaAs Substrate", S.Yamamoto et al, 320 Applied Physics Letters, vol. 40, (1982), Mar. No. 5, pp. 372-374.
"Mode Characteristics of Large-Optical-Cavity V--Channeled Substrate Inner Stripe Injection Lasers", T. Hayakawa, et al, 8106 IEEE Journal of Electronics, vol. QE-19, (1983), Oct. No. 10, pp. 1530-1536.

Primary Examiner—James W. Davie
Attorney, Agent, or Firm—Birch, Stewart, Kolasch & Birch

[57] ABSTRACT

A window VSIS semiconductor laser includes a stimulated region and window regions formed on both ends of the stimulated region. A V-shaped groove is formed in a substrate, and an active layer is formed on the substrate. In one preferred form, the V-shaped groove has a wider width in the stimulated region as compared with the V-shaped groove formed in the window regions. The active layer is a crescent active layer in the stimulated region. One edge of the V-shaped groove in the stimulated region is continuously aligned on a line to the corresponding edge of the V-shaped groove formed in the window regions so as to enhance the optical coupling. In another preferred form, indents are formed in the substrate in the window regions in a manner to sandwich the V-shaped groove formed in the window regions. The V-shaped groove has the same width in the stimulated region and in the window regions. The active layer is plane shaped in the stimulated region, and a thickness of the active layer in the stimulated region is thicker than the active layer formed in the window regions.

9 Claims, 8 Drawing Figures

4,686,679

WINDOW VSIS SEMICONDUCTOR LASER

BACKGROUND OF THE INVENTION

1. Field of the Invention

The present invention relates to a window V-channeled substrate inner stripe (referred to as VSIS hereinafter) laser.

2. Description of the Prior Art

A window VSIS laser is proposed in copending U.S. patent application Ser. No. 476,844, "SEMICONDUCTOR LASER", filed on Mar. 18, 1983 by Saburo YAMAMOTO, Hiroshi HAYASHI and Seiki YANO, U.S. Pat. No. 4,546,481 and assigned to the same assignee as the present application. The corresponding European Patent Application was published on Dec. 7, 1983 as No. 0095826. The conventional window VSIS laser does not show a smooth mode conversion between the window region having a plane active layer, and a stimulated region having a crescent active layer. Therefore, the operational mode is not stable at a high power operation. Furthermore, it is difficult to accurately control the manufacture of the crescent active layer in the normal liquid phase epitaxial method.

OBJECTS AND SUMMARY OF THE INVENTION

OBJECTS OF THE INVENTION

Accordingly, an object of the present invention is to provide a semiconductor laser which ensures a stable operation even at a high power operation.

Another object of the present invention is to provide a window VSIS semiconductor laser which shows a stable oscillation even when the ambient temperature varies.

Still another object of the present invention is to provide a novel structure in a window VSIS semiconductor laser, which ensures stable manufacturing of the window VSIS semiconductor laser.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

SUMMARY OF THE INVENTION

To achieve the above objects, pursuant to an embodiment of the present invention, a V-shaped groove is formed in a semiconductor substrate. A stimulated region includes a crescent active layer along the V-shaped groove. A window region includes a plane active layer. The stripe width in the stimulated region is wider than that in the window region. In a preferred form, one edge of the stripe groove is formed continuously even at the boundary between the stimulated region and the window region so as to ensure a smooth coupling between the stimulated region and the window region.

In another preferred form, indents are formed in the substrate at the window region. The active layer in the window region is thinner than the active layer in the stimulated region and, therefore, the active layer in the stimulated region is not necessarily the crescent active layer. This structure ensures a stable formation of the window VSIS semiconductor laser.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
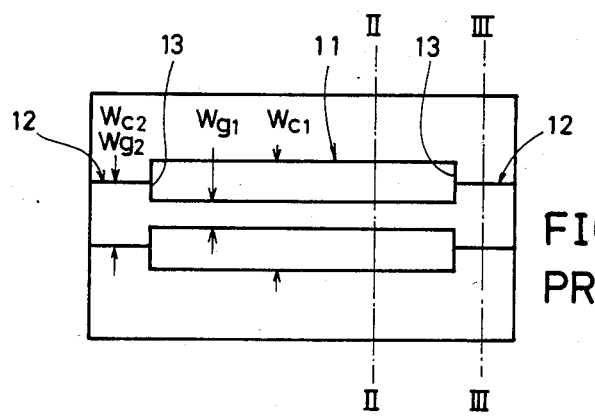
FIG. 1 is a plan view of the conventional window VSIS semiconductor laser.
Figure 2:
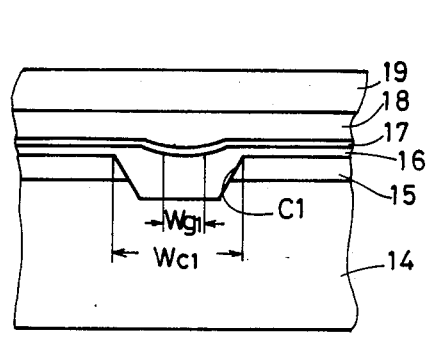
FIG. 2 is a sectional view taken along line II—II of FIG. 1.
Figure 3:
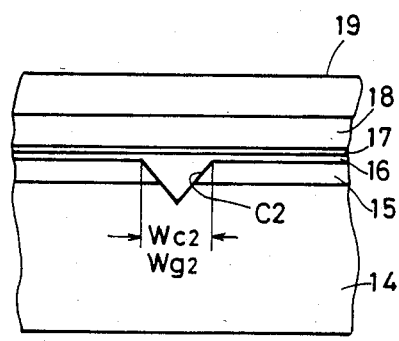
FIG. 3 is a sectional view taken along line III—III of FIG. 1.

In order to facilitate an understanding of the present invention, an example of the conventional window VSIS semiconductor laser will be first described with reference to FIGS. 1, 2 and 3. The window VSIS semiconductor laser of FIGS. 1, 2 and 3 has the same structure as that disclosed in the copending U.S. patent application Ser. No. 476,844, U.S. Pat. No. 4,546,481. FIG. 1 is a plan view of the conventional window VSIS semiconductor laser. FIG. 2 shows the structure at the stimulated region, and FIG. 3 shows the structure at the window region.

The stripe width $W_{c1}$ of a V-shaped groove at a stimulated region 11 is wider than the stripe width $W_{c2}$ of the V-shaped groove in window regions 12. By this structure, an active layer 17 in the stimulated region has a crescent configuration, and the active layer 17 at the window region has a plane configuration. Further, the active layer 17 in the stimulated region is thicker than the active layer 17 in the window region. The thus formed window VSIS semiconductor laser shows the laser emission at the wavelength of 780 nm and at the output power below 120 mW at which the thermal saturation occurs. Further, the window VSIS semiconductor laser of FIG. 1 shows a stable fundamental transverse mode below the output power of 60 mW.

In the conventional window VSIS semiconductor laser, the V-shaped groove is not continuous at a boundary 13 provided between the stimulated region 11 and the window region 12. Therefore, the laser beam is reflected at the boundary 13. That is, a smooth mode conversion is not achieved between the stimulated region 11 and the window region 12. This precludes a stable operation at a high power output operation.

Figure 4:
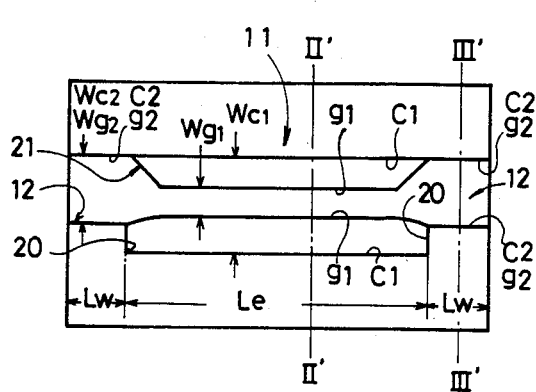
FIG. 4 is a plan view of an embodiment of a window VSIS semiconductor laser of the present invention.

FIG. 4 shows an embodiment of a window VSIS semiconductor laser of the present invention. The stimulated region (taken along line II'—II') has the similar sectional structure as that disclosed in FIG. 2. The window region (taken along line III'—III') has the similar sectional structure as that disclosed in FIG. 3.

A V-shaped groove $C_1$ in the stimulated region 11 has a width $W_{c1}$ which is wider than a width $W_{c2}$ of a V-shaped groove $C_2$ in the window regions 12. One edge of the V-shaped groove $C_1$ in the stimulated region is formed at a position where the edge is aligned on the same line with respect to one edge of the V-shaped groove $C_2$ formed in the window region 12. Since the stripe width $W_{c1}$ is wider than the stripe width $W_{c2}$, the remaining edge forms a discontinuous boundaries 20 between the stimulated region 11 and the window regions 12.

The following description is related to the manufacturing steps of the window VSIS semiconductor laser of FIG. 4. Since the sectional structure is similar to that disclosed in FIGS. 2 and 3, the explanation is provided with reference to FIGS. 2, 3 and 4.

An n-GaAs layer 15 (Te-doped concentration $6 \times 10^{-18} \text{cm}^{-3}$) is formed, by the liquid phase epitaxial method, on a p-GaAs substrate 14 (Zn-doped concentration $1 \times 10^{-10} \text{cm}^{-3}$) to have the thickness of about 0.6 microns. The V-shaped groove ($C_1$, $C_2$) having the stripe width $W_{c1}$ and $W_{c2}$ is formed in the n-GaAs layer 15 through the use of the photolithography method. In a preferred form, the stimulated region has a length $L_e$ of about 150 microns, and the window region has a length $L_w$ of about 50 microns. The stripe width $W_{c1}$ in the stimulated region is preferably about 6 microns, and the stripe width $W_{c2}$ in the window region is preferably about 3 microns. Therefore, the boundary 20 formed at one edge provided between the stimulated region and the window region has the width of about 3 microns. A p-Ga$_{0.5}$Al$_{0.5}$As cladding layer 16, a p-Ga$_{0.85}$Al$_{0.15}$As active layer 17, an n-Ga$_{0.5}$Al$_{0.5}$As cladding layer 18, and an n-GaAs cap layer 19 are sequentially formed on the n-GaAs layer 15 by the liquid phase epitaxial method. That is, the double-hetero structure is formed. Each layer 16, 17, 18 and 19 has the thickness of about 0.15 microns, 0.1 microns, 1.0 micron and 2.0 microns, respectively, at the plane portion thereof. Electrodes are formed on both sides, and the laser device is formed by cleaving the semiconductor wafer. A waveguide $g_1$ is formed in the stimulated region, and a waveguide $g_2$ is formed in the window region.

Since the one edge of the V-shaped groove is formed continuously between the stimulated region and the window regions, a smooth optical coupling is ensured. A stable oscillation in the fundamental mode is conducted even at a high power output. More specifically, the laser emission in the fundamental mode is ensured at the output of 120 mW. The waveguides $g_1$ and $g_2$ are slightly discontinuous between the stimulated region and the window regions as shown in FIG. 4. Accordingly, the window VSIS semiconductor laser of FIG. 4 functions as the inner interference type. Therefore, the transverse mode is very stable.

Figure 5:
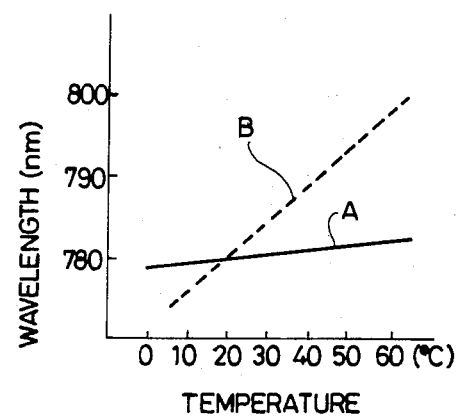
FIG. 5 is a graph showing the laser wavelength which varies depending on the operating temperature, in the conventional window VSIS semiconductor laser of FIG. 1 and in the window VSIS semiconductor laser of FIG. 4.

FIG. 5 shows the variation of the laser wavelength depending on the temperature variation. The curve A shows the wavelength variation in the window VSIS semiconductor laser of FIG. 4. The wavelength varies at the rate of 0.6 Å/°C. when the operating temperature changes from 0° C. to 60° C. The curve B shows the wavelength variation in the conventional window VSIS semiconductor laser shown in FIG. 1, wherein the wavelength varies at the rate of 3 Å/°C.

Figure 6:
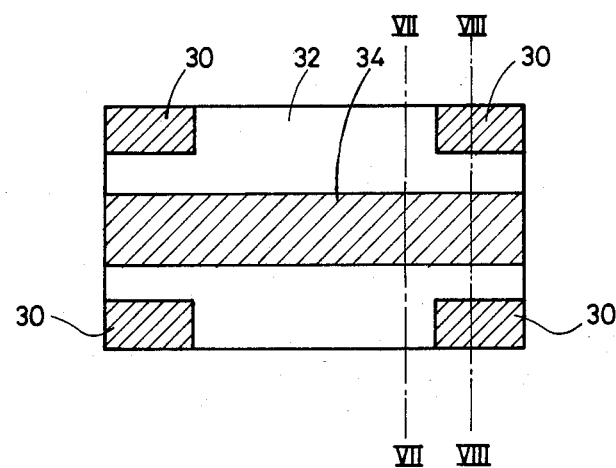
FIG. 6 is a plan view of another embodiment of a window VSIS semiconductor laser of the present invention.
Figure 7:
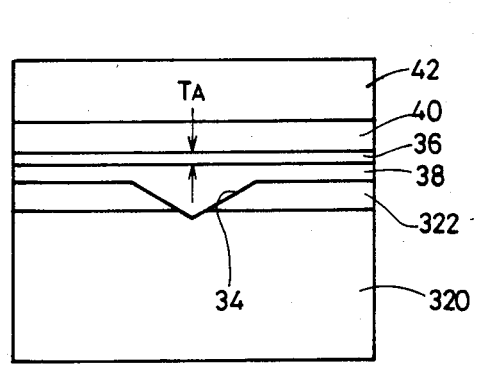
FIG. 7 is a sectional view taken along line VII—VII of FIG. 6.
Figure 8:
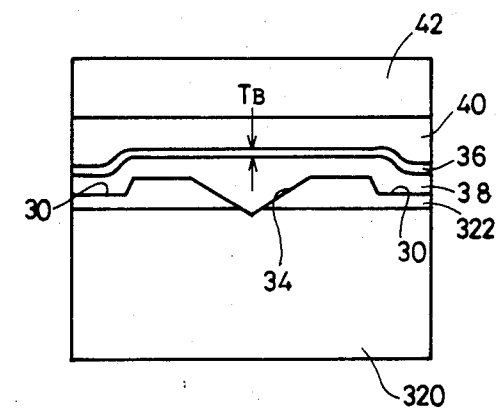
FIG. 8 is a sectional view taken along line VIII—VIII of FIG. 6.

The window VSIS semiconductor laser of FIG. 4 includes the crescent active layer as shown in FIG. 2. It is difficult to properly control the crescent configuration of the active layer. FIG. 6 shows another embodiment of the window VSIS semiconductor laser of the present invention, which includes a plane active layer even in the stimulated region, and the V-shaped groove is formed continuously between the stimulated region and the window regions. FIG. 7 shows the sectional structure of the stimulated region, and FIG. 8 shows the sectional structure of the window region.

Indents 30 are formed in a substrate 32 at the window regions so as to sandwich a V-shaped groove 34. With the provision of the indents 30, a thickness $T_A$ of an active layer 36 in the stimulated region is thicker than a thickness $T_B$ of the active layer 36 in the window regions. The V-shaped groove 34 has the same width in the stimulated region and in the window regions, and the active layer 36 in the stimulated region has the plane configuration.

In a preferred form, the substrate 32 includes a p-GaAs first layer 320 (Zn-doped concentration $1 \times 10^{-19} \text{cm}^{-3}$), and an n-GaAs second layer 322 (Te-doped concentration $6 \times 10^{-18} \text{cm}^{-3}$) formed by the liquid phase epitaxial method. A p-Ga$_{0.5}$Al$_{0.5}$As cladding layer 38 is formed on the n-GaAs second layer 322, the p-Ga$_{0.85}$Al$_{0.15}$As active layer 36 is formed on the cladding layer 38, an n-Ga$_{0.5}$Al$_{0.5}$As cladding layer 40 is formed on the active layer 36, and an n-GaAs cap layer 42 is formed on the cladding layer 40.

The manufacturing steps are as follows. The n-GaAs second layer 322 preferably has a thickness of about 1.0 micron. A resist film is deposited on the substrate 32 to cover the n-GaAs second layer 322 except the V-shaped groove portion. The etching operation is carried out into the n-GaAs second layer 322 to the depth of about 0.7 microns. Then, the resist film is removed at the indent portions, and the etching operation is carried out into the n-GaAs second layer 322 to the depth of about 0.5 microns. With this sequential etching, the V-shaped groove has the depth of about 1.2 microns, and the V-shaped groove 34 reaches the p-GaAs first layer 320 so as to form the current path. In a preferred form, the stimulated region has a length of about 150 microns, and each of the window regions has a length of about 50 microns.

While the active layer 36 is formed by the liquid phase epitaxial method, arsenic (As) included in the gallium (Ga) solution is used to bury the indents 30 in the window regions. The epitaxial growth of the active layer 36 in the window regions is slower than that in the stimulated region and, therefore, the thickness $T_B$ of the active layer 36 in the window regions becomes thinner than the thickness $T_A$ of the active layer 36 in the stimulated region. In a preferred form, the thickness $T_A$ of the active layer 36 in the stimulated region is about 0.2 microns, and the thickness $T_B$ of the active layer 36 in the window regions is about 0.1 microns.

Since the window regions have the thinner active layer, the laser beam emitted in the stimulated region is not absorbed in the window regions. The V-shaped groove is continuous between the stimulated region and the window regions. Further, the stimulated region includes the plane active layer.

The invention being thus described, it will be obvious that the same may be varied in many ways without departure from the spirit and scope of the invention, which is limited only by the following claims.

What is claimed is:

1. A semiconductor element in a window VSIS semiconductor laser, comprising:
   a substrate;
   a first semiconductor layer disposed on said substrate
   a V-shaped groove formed in said semiconductor layer,
   an active layer disposed above said first semiconductor layer, including that region of said first semiconductor layer in which said V-shaped groove is formed;
   a stimulated region including a portion of each of said substrate, said first semiconductor layer having said V-shaped groove and said active layer; and
   a pair of window regions, one window region formed at each end of said stimulated region and each window region including a portion of said substrate, said first semiconductor layer having said V-shaped groove and said active layer wherein said portions constituting said window regions are distinct from said portions constituting said stimulated region;
   wherein at least one edge of said portion of said V-shaped groove in said stimulated region is aligned on a same line as the corresponding edge of said portion of said V-shaped groove in each of said pair of window regions.

2. The semiconductor element of claim 1, wherein said portion of said V-shaped groove formed in said stimulated region has a width wider than said portion of said V-shaped groove formed in each of said window regions.

3. The semiconductor element of claim 2, wherein said portions of said active layer in said window regions have a plane configuration, and said portion of said active layer in said stimulated region has a crescent configuration.

4. The of claim 1, wherein said V-shaped groove has the same width in said stimulated region as in said window regions, and wherein each of the edges of said V-shaped groove is aligned on a line with corresponding edges of said V-shaped groove in said stimulated region and in said window regions.

5. The semiconductor element of claim 4, wherein said substrate includes indents formed in said window regions so as to sandwich said portion of said V-shaped groove formed in said window regions.

6. The semiconductor element of claim 5, wherein said portion of said active layer formed in said stimulated region is thicker than said portions of said active layer formed in each of said window regions.

7. The semiconductor element of claim 1 wherein said portion of said active layer in said stimulated region has physical characteristics different from that of said portions of said active layer in each of said pair of window regions.

8. The semiconductor element of claim 7 wherein said portion of said active layer in said stimulated region has a crescent configuration while said portions of said active layer in said window regions have a plane configuration.

9. The semiconductor element of claim 7 wherein said portion of said active layer formed in said stimulated region is thicker than said portions of said layer formed in each of said window regions.

* * * * *